(12) United States Patent
Kukita

(10) Patent No.: US 12,057,356 B2
(45) Date of Patent: Aug. 6, 2024

(54) ELECTRONIC ELEMENT MOUNTING SUBSTRATE AND ELECTRONIC DEVICE

(71) Applicant: KYOCERA Corporation, Kyoto (JP)

(72) Inventor: Eiji Kukita, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 410 days.

(21) Appl. No.: 17/417,794

(22) PCT Filed: Dec. 25, 2019

(86) PCT No.: PCT/JP2019/050928
§ 371 (c)(1),
(2) Date: Jun. 24, 2021

(87) PCT Pub. No.: WO2020/138210
PCT Pub. Date: Jul. 2, 2020

(65) Prior Publication Data
US 2022/0077012 A1    Mar. 10, 2022

(30) Foreign Application Priority Data

Dec. 26, 2018 (JP) .................................. 2018-243329

(51) Int. Cl.
*H01L 23/053*    (2006.01)
*H01L 23/00*    (2006.01)
*H01L 33/48*    (2010.01)
*H01L 33/64*    (2010.01)

(52) U.S. Cl.
CPC .......... *H01L 23/053* (2013.01); *H01L 24/48* (2013.01); *H01L 33/486* (2013.01); *H01L 33/644* (2013.01); *H01L 2224/48177* (2013.01); *H01L 2924/17151* (2013.01)

(58) Field of Classification Search
CPC ............... H01L 23/053; H01L 24/48; H01L 2224/48177; H01L 2924/17151; H01L 23/10; H01L 24/49; H01L 2224/48091; H01L 2224/48227; H01L 2224/49175; H01L 2924/00014; H01L 2924/15151; H01L 2924/15156; H01L 2924/15162; H01L 2924/16195; H01L 21/54;
(Continued)

(56) References Cited

U.S. PATENT DOCUMENTS

2005/0169620 A1* 8/2005 Minamio .......... H01L 27/14618
257/E31.118
2014/0084322 A1* 3/2014 Park ...................... H01L 33/486
257/98

FOREIGN PATENT DOCUMENTS

| JP | 2004-342992 A | 12/2004 |
| JP | 2007-088194 A | 4/2007 |
| JP | 2007-128987 A | 5/2007 |

* cited by examiner

*Primary Examiner* — Patricia D Valenzuela
(74) *Attorney, Agent, or Firm* — Volpe Koenig

(57) ABSTRACT

An electronic element mounting substrate according to the present disclosure includes a base body having a recessed portion including a mounting region on which an electronic element is mounted and a cutout section located on an outer periphery of the base body in a plane perspective, and a channel having an inner end portion located on an inner wall of the base body and an outer end portion located on the outer periphery of the base body. The inner end portion of the channel is open to the recessed portion, and the outer end portion of the channel is continuous with the cutout section.

20 Claims, 16 Drawing Sheets

(58) Field of Classification Search
CPC ....... H01L 23/04; H01L 23/12; H01L 33/644; H01L 33/486
See application file for complete search history.

ELECTRONIC ELEMENT MOUNTING SUBSTRATE AND ELECTRONIC DEVICE

TECHNICAL FIELD

The present disclosure relates to an electronic element mounting substrate on which an electronic element or the like is mounted, and an electronic device.

BACKGROUND ART

An electronic element mounting substrate is known that includes a substrate including an insulating layer and a wiring layer and being provided with a recessed portion. Further, such an electronic element mounting substrate is known to have a structure having a channel through which the recessed portion communicates with the outside. (See JP 2007-128987 A).

After manufacturing an electronic device in which an electronic element is mounted in the recessed portion of the electronic element mounting substrate and sealed with a lid or the like, gas may be injected/discharged through the channel in order to replace the air inside the electronic device with an appropriately selected gas such as nitrogen. When injecting/discharging gas in the recessed portion using the channel, there is a concern that dust or the like may enter through the channel.

Further, in the step of bonding the lid or the like when manufacturing the electronic device, there is a case in which only water vapor or the like is discharged so as not to accumulate inside the electronic device (gas is not intentionally injected/discharged). In this step, since the gas is not intentionally discharged, when, for example, the channel is in the same place as an electrode or in the vicinity of the electrode and dust or the like enters through the channel, the next step is performed with the dust remaining in the vicinity of the electrode. Thereafter, in a case where the electronic device is mounted on an external device and then vibration or the like is applied to the electronic device from the outside, there is a concern that dust located near the electrodes may move and cause a short circuit between the electrodes, thereby causing a malfunction.

SUMMARY

An electronic element mounting substrate according to one aspect of the present disclosure includes a base body having a recessed portion including a mounting region on which an electronic element is mounted, and a cutout section located on an outer periphery of the base body in a plane perspective, and a channel having an inner end portion located on an inner wall of the base body and an outer end portion located on the outer periphery of the base body. The inner end portion of the channel is open to the recessed portion, and the outer end portion of the channel is continuous with the cutout section.

DESCRIPTION OF EMBODIMENTS

Figure 1A:
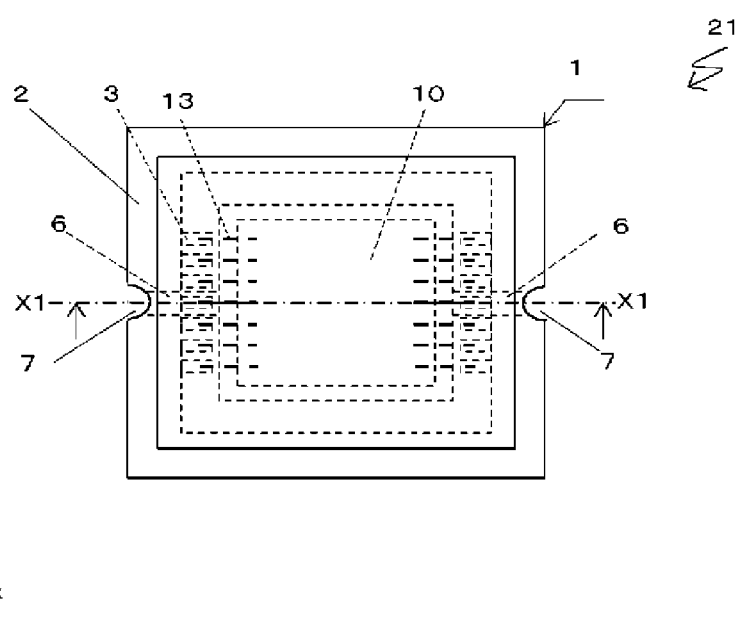
FIG. 1A is a top view illustrating an outer appearance of an electronic element mounting substrate and an electronic device according to an embodiment of the present disclosure.
Figure 1B:
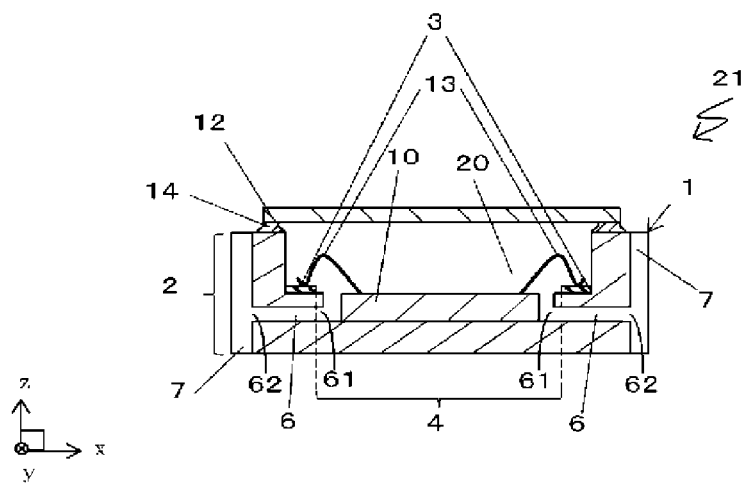
FIG. 1B is a longitudinal cross-sectional view corresponding to a line X1-X1 in FIG. 1A.

Configuration of Electronic Element Mounting Substrate and Electronic Device

Several exemplary embodiments of the present disclosure will be described hereinafter with reference to the drawings. In the following description, an electronic device is configured by mounting an electronic element on an electronic element mounting substrate. Any direction may be defined as upward or downward for the electronic element mounting substrate and the electronic device, but for the sake of simplicity, an xyz orthogonal coordinate system is defined and a positive side in the z direction is defined as upward. The electronic element refers to, for example, an imaging element such as a charge coupled device (CCD) or a complementary metal oxide semiconductor (CMOS), a light emitting element such as a light emitting diode (LED), an element having a sensor function such as pressure, air pressure, acceleration, a gyroscope, or the like, and an integrated circuit.

First Embodiment

An electronic element mounting substrate 1 and an electronic device 21 provided with the electronic element mounting substrate 1 according to a first embodiment of the present disclosure will be described with reference to FIGS. 2 to 5. Note that in the present embodiment, the electronic device 21 is illustrated in FIGS. 2 to 5.

The electronic element mounting substrate 1 includes a substrate 2a having a mounting region 4 on which an electronic element 10 is mounted on an upper surface thereof, and having a cutout section 7 on an outer periphery in a plane perspective. There is a frame body 2d located on the upper surface of the substrate 2a and surrounding the mounting region 4. The frame body 2d has a channel 6 having an inner end portion 61 located on an inner wall of the frame body 2d and an outer end portion 62 located on an outer periphery of the frame body 2d or the substrate 2a. The outer end portion 62 of the channel 6 is continuous with the cutout section 7.

Here, the mounting region 4 is a region on which at least one or more electronic elements 10 are mounted, and can be appropriately defined as, for example, the inside of the outermost periphery of an electrode pad 3, which will be described later, a region where a lid is mounted, and more. Further, a component mounted on the mounting region 4 is not limited to the electronic element 10, and may be, for example, an electronic component, and the number of electronic elements 10 and/or electronic components is not specified.

Figure 2A:
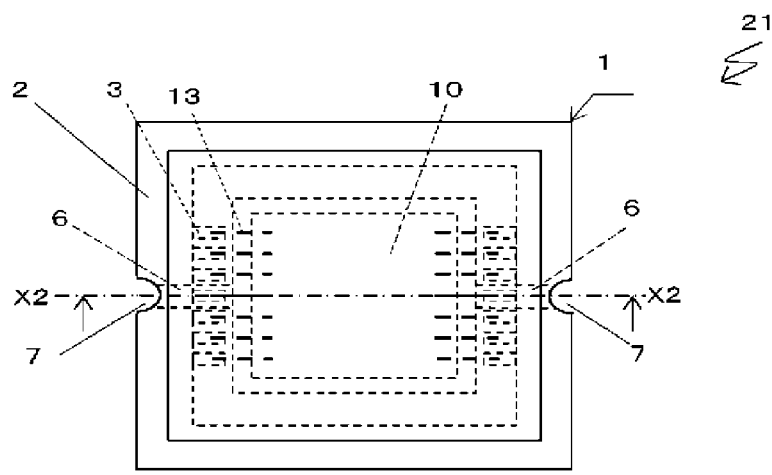
FIG. 2A is a top view illustrating an outer appearance of an electronic element mounting substrate and an electronic device according to a first embodiment of the present disclosure.
Figure 2B:
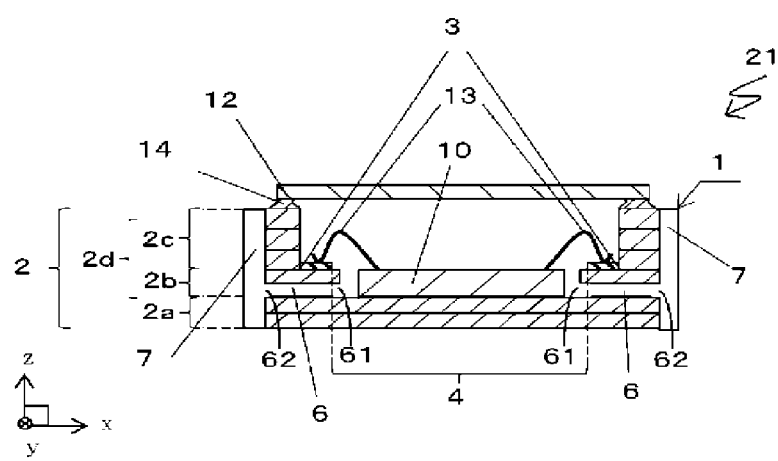
FIG. 2B is a longitudinal cross-sectional view corresponding to a line X2-X2 in FIG. 2A.

The substrate 2a has the cutout section 7. In FIG. 2, each of the semicircular cutout sections 7 is provided on each of right and left sides. As will be described later, the shape of the cutout section 7 may be other than semicircular, and a location and a number can be set arbitrarily. Regarding the size in a z direction, the cutout section 7 may be present only in the substrate 2a, may be present through the frame body 2d, or may be present from the lower surface of a base body 2 to the middle of the base body 2. Additionally, the channel 6 may have the inner end portion 61 located on a bottom surface of a recessed portion 20 of the base body 2, and may be connected to the outside. Even in these cases, it is possible to obtain individual effects.

The frame body 2d may be constituted of only a first frame body 2b or a second frame body 2c, or may be constituted of both the first frame body 2b and the second frame body 2c. Frame bodies such as a third frame body or a fourth frame body may be further added.

Hereinafter, a combination of the substrate 2a, the first frame body 2b, and the second frame body 2c is referred to as the base body 2. In the example illustrated in FIG. 2, the base body 2 constituted of the substrate 2a, the first frame body 2b, and the second frame body 2c is formed of a plurality of insulating layers. However, for example, the base body 2 may have a configuration with only one layer such as a configuration formed by a mold or a configuration formed by pressing using a metal mold. Examples of material of the insulating layer forming the base body 2 include electrically insulating ceramic and resin. As illustrated in FIG. 2, the recessed portion 20 of the base body 2 is a space surrounded by the substrate 2a and the frame body 2d. At this time, there is the mounting region 4 on the upper surface of the base body 2. The base body 2 has the channel 6 having the inner end portion 61 located on the inner wall of the base body 2 and the outer end portion 62 located on the outer periphery of the base body 2. The outer end portion 62 of the channel 6 is continuous with the cutout section 7. Additionally, the inner end portion 61 of the channel 6 is open to the recessed portion 20.

Examples of the electrically insulating ceramic used as the material of the insulating layers forming the base body 2 include an aluminum oxide-based sintered body, a mullite-based sintered body, a silicon carbide sintered body, an aluminum nitride-based sintered body, a silicon nitride-based sintered body, a glass ceramic sintered body, and the like. Examples of the resin used as the material of the insulating layers forming a base body 2 include a thermoplastic resin, an epoxy resin, a polyimide resin, an acrylic resin, a phenol resin, a fluorine-based resin and the like. Examples of the fluorine-based resin include an ethylene tetrafluoride resin.

As illustrated in FIG. 2, the base body 2 may be formed of seven insulating layers, or may be formed of six or less or eight or more insulating layers. When the number of insulating layers is six or less, the thickness of the electronic element mounting substrate 1 can be reduced. On the other hand, when the number of insulating layers is eight or more, the rigidity of the electronic element mounting substrate 1 can be increased.

The size of one side of the outermost periphery of the electronic element mounting substrate 1 is, for example, from 0.3 mm to 10 cm. When the electronic element mounting substrate 1 is a quadrilateral shape in a plan view, it may be square or rectangular. Further, for example, the thickness of the electronic element mounting substrate 1 may be 0.2 mm or greater.

The frame body 2d of the electronic element mounting substrate 1 has the channel 6 having the inner end portion 61 located on the inner wall of the frame body 2d and the outer end portion 62 located on the outer periphery of the frame body 2d or the substrate 2a. The outer end portion 62 of the channel 6 is continuous with the cutout section 7. The channel 6 may have a rectangular shape in a cross-sectional view taken along an X2-X2 line, or a rectangular shape in a plane perspective. In particular, having the rectangular shape in the cross-sectional view shortens a distance between the outside of the base body 2 and the inside of the base body 2, which makes it easier to inject/discharge gas through the channel.

After manufacturing an electronic device in which an electronic element is mounted in the recessed portion of the electronic element mounting substrate 1 and sealed with a lid or the like, gas may be injected/discharged through the channel in order to replace the air inside the electronic device with an appropriately selected gas such as nitrogen. When injecting/discharging gas in the recessed portion using the channel, there is a concern that dust or the like may enter through the channel.

On the other hand, an opening portion of the channel 6 needs to have a certain size in order to inject/discharge gas. However, there is a concern that the opening portion may be clogged with the dust in, for example, the step of manufacturing the channel 6 and/or the step of transferring the electronic element mounting substrate 1. There is also a concern that the opening portion may be crushed because the equipment used for transferring the electronic element mounting substrate 1 comes into contact with the periphery of the opening portion.

In contrast, since the end portion of the channel 6 is located in the cutout section 7, the cutout section 7 can have a role of protecting the end portion of the channel 6. This makes it possible to reduce the clogging of the opening portion of the channel 6 with dust. Additionally, since the end portion of channel 6 is located in the cutout section 7, it is possible to reduce the contact of the equipment used when transferring the electronic element mounting substrate 1 with the periphery of the opening portion. In view of these, it is possible to maintain an area of the opening portion at the outer end portion of the channel 6, which makes it possible to reduce failure when gas is injected/discharged using the channel 6.

In the example illustrated in FIG. 2, the channel 6 of the electronic element mounting substrate 1 is located between the substrate 2a and the first frame body 2b.

After manufacturing the electronic device in which the electronic element is mounted in the recessed portion of the electronic element mounting substrate and sealed with the lid or the like, gas may be injected/discharged through the channel in order to replace the air inside the electronic device with an appropriately selected gas such as nitrogen. In recent years, terminals of the electronic element have become smaller in pitch, and the diameter of a wire electrically connecting the electronic element and the electronic element mounting substrate has also become smaller. Therefore, there is a concern that the wire may be bent due to force of the gas, resulting in a short circuit between adjacent wires in the step of injecting/discharging gas using the channel of the electronic device. There is also a concern that bonding strength between the wire and the electrode pad of the electronic element mounting substrate may decrease due to gas pressure in the step of injecting/discharging gas.

In contrast, in the example illustrated in FIG. 2, the electronic element mounting substrate 1 has the channel 6 located between the substrate 2a and the first frame body 2b and extending from the inner wall of the first frame body 2b to the outside. In other words, one end of the opening portion of the channel 6 is located below the electrode pad 3 described later in a cross-sectional view taken along a line X2-X2. This makes it possible to reduce the amount of gas directly blown onto the wire 13 in the step of injecting/discharging gas using the channel 6. Thus, it is possible to reduce the likelihood that the wire 13 is bent by the gas blown and a short circuit is caused between adjacent wires. Therefore, it is possible to reduce a decrease in the yield of the electronic device 21.

Here, the electrode pad 3 may be provided on the upper surface of the substrate 2a or the upper surface of the first frame body 2b. Here, the electrode pad 3 refers to a pad that is electrically connected to the electronic element 10, for example.

Further, an external circuit connection electrode may be provided on the upper surface, the side surface, or the lower surface of the base body 2 of the electronic element mounting substrate 1. The external circuit connection electrode may electrically connect the base body 2 to the external circuit board or the electronic device 21 to the external circuit board.

Further, in addition to the electrode pad 3 and/or the external circuit connection electrode, electrodes formed between insulating layers, internal wiring electrical conductors, and through conductors vertically connecting the internal wiring electrical conductors to each other may be provided on the upper surface or lower surface of the base body 2 The electrode, the internal wiring electrical conductor, or the through-hole conductor may be exposed on the surface of the base body 2. The electrode pad 3 and/or the external circuit connection electrode may each be electrically connected by the electrode, the internal wiring electrical conductor, or the through-hole conductor.

When the base body 2 is made of electrically insulating ceramic, the electrode pad 3, the external circuit connection electrode, the internal wiring electrical conductor, and/or the through-hole conductor contains tungsten (W), molybdenum (Mo), manganese (Mn), palladium (Pd), silver (Ag), or copper (Cu), or an alloy containing at least one metal material selected from these metals, or the like. Further, the electrode pad 3, the external circuit connection electrode, and/or the through-hole conductor may contain only copper (Cu). When the base body 2 is formed of a plurality of layers of resin, the electrode pad 3, the external circuit connection electrode, the internal wiring electrical conductor, and/or the through-hole conductor contains copper (Cu), gold (Au), aluminum (Al), nickel (Ni), molybdenum (Mo), palladium (Pd), or titanium (Ti), or an alloy containing at least one metal material selected from these metals, or the like.

A plated layer may be further provided on the exposed surface of the electrode pad 3, the external circuit connection electrode, the internal wiring electrical conductor, and/or the through-hole conductor. According to this configuration, oxidation can be suppressed by protecting the exposed surface of the external circuit connection electrode, the internal wiring electrical conductor, and/or the through-hole conductor. In addition, according to this configuration, the electrode pad 3 and the electronic elements 10 can be electrically connected favorably via a connection conductor 13 such as a wire. The plating layer may be formed by depositing a nickel (Ni) plating layer having a thickness from 0.5 μm to 10 μm, or by sequentially depositing the nickel plating layer and a gold (Au) plating layer having a thickness from 0.5 μm to 3 μm.

Figure 3A:
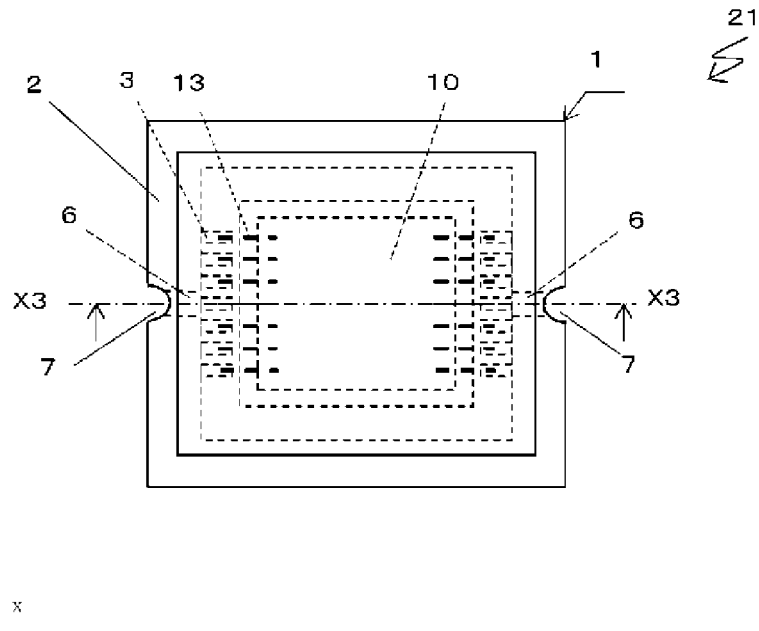
FIG. 3A is a top view illustrating an outer appearance of an electronic element mounting substrate and an electronic device in another aspect according to the first embodiment of the present disclosure.
Figure 3B:
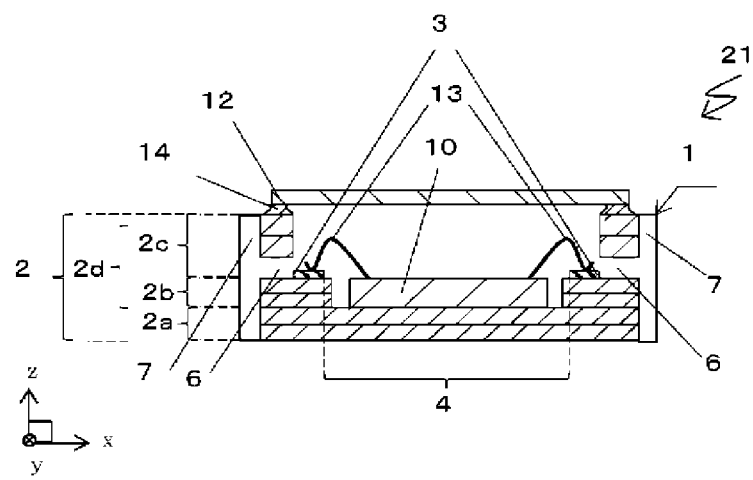
FIG. 3B is a longitudinal cross-sectional view corresponding to a line X3-X3 in FIG. 3A.
Figure 4A:
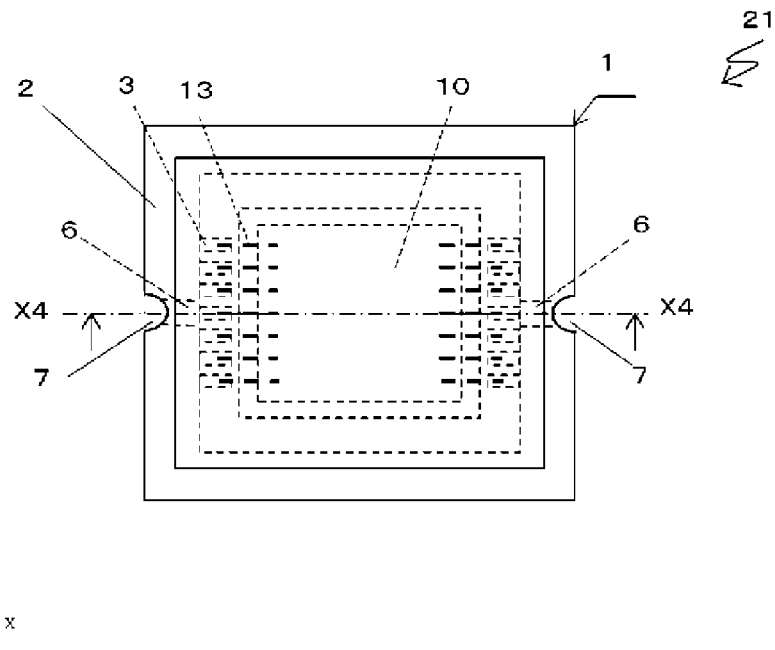
FIG. 4A is a top view illustrating an outer appearance of an electronic element mounting substrate and an electronic device according to still another aspect of the first embodiment of the present disclosure.
Figure 4B:
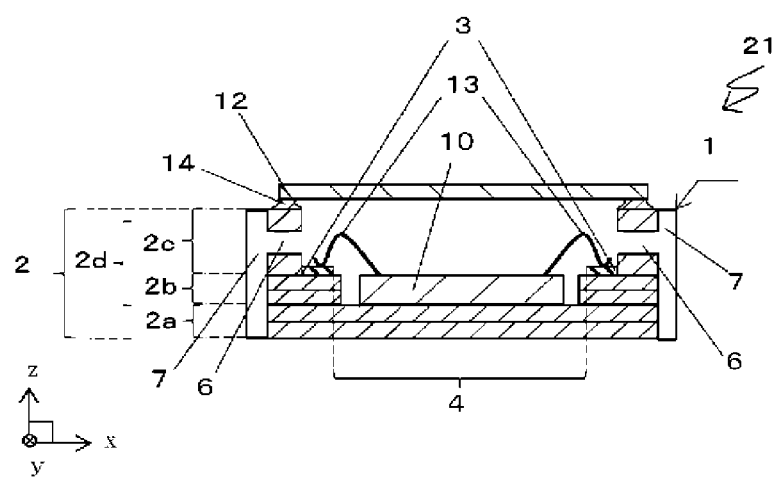
FIG. 4B is a longitudinal cross-sectional view corresponding to a line X4-X4 in FIG. 4A.

In the examples illustrated in FIGS. 3 and 4, the channel 6 of the electronic element mounting substrate 1 is located above relative to the electrode pad 3.

In the electronic element mounting substrate 1 as in the example illustrated in FIG. 4, the electrode pad 3 is located on the upper surface of the substrate 2a or the first frame body 2b, and the channel 6 that extends from the inner wall of the second frame body 2c to the outside is provided. In other words, the one end of the opening portion of the channel 6 is located above relative to the electrode pad 3 in a cross-sectional view taken along a line X4-X4. This makes it possible to reduce the amount of gas directly blown onto the wire 13 or to reduce the area in which the gas is blown onto the wire 13 in the step of injecting/discharging gas using the channel 6. Thus, it is possible to reduce the likelihood that the wire 13 is bent by the gas blown and a short circuit is caused between adjacent wires. Therefore, it is possible to reduce a decrease in the yield of the electronic device 21. Further, the structure of the present embodiment makes it possible to reduce stress applied to the bonding portion between the electrode pad 3 and the wire 13. Thus, it is possible to suppress a decrease in the bonding strength between the electrode pad 3 and the wire 13 due to the stress by the gas.

Figure 5A:
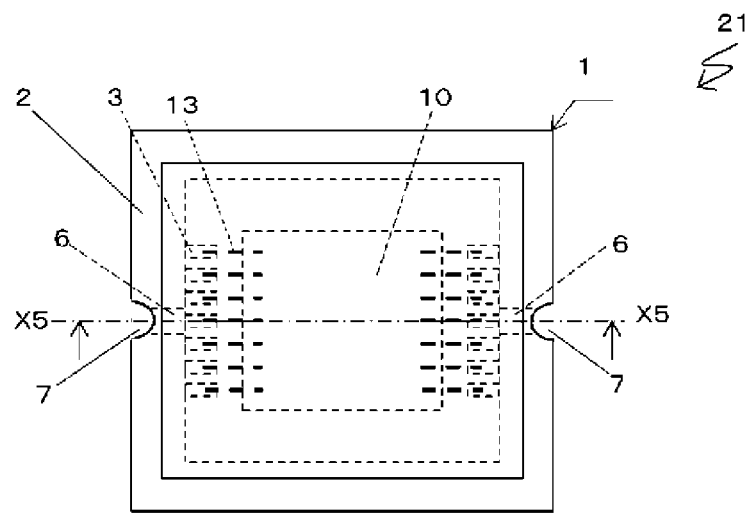
FIG. 5A is a top view illustrating an outer appearance of an electronic element mounting substrate and an electronic device according to an aspect of the first embodiment of the present disclosure.
Figure 5B:
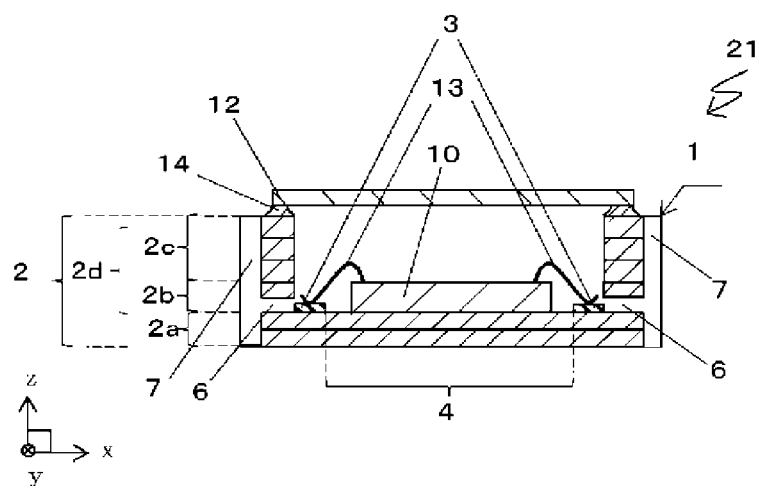
FIG. 5B is a longitudinal cross-sectional view corresponding to a line X5-X5 in FIG. 5A.

In the electronic element mounting substrate 1, the electrode pad 3 may be located on the upper surface of the first frame body 2b as in the examples illustrated in FIGS. 3 and 4, or may be located on the upper surface of the substrate 2a as in the example illustrated in FIG. 5. In the electronic element mounting substrate 1, since the electrode pad 3 is located on the upper surface of the first frame body 2b as in the examples illustrated in FIGS. 3 and 4, the position of the upper surface of the electronic element 10 mounted on the mounting region 4 and the position of the electrode pad 3 in a cross-sectional view can be set to substantially the same height position. Thus, the length of the wire 13 can be shortened. This makes it possible to improve electrical characteristics. Further, since the length of the wire 13 is short, the amount of deflection of the wire 13 can be reduced in the step of injecting/discharging gas using the channel 6. Thus, it is possible to reduce the likelihood that the wires 13 of the electrode pads 3 adjacent to each other come into contact with each other, which makes it possible to improve the effects of the present embodiment.

In the example illustrated in FIG. 4, since the one end of the opening portion of the channel 6 is located upper relative to the electrode pad 3 in a cross-sectional view, dust entering through the channel 6 is less likely to adhere to the vicinity of the electrode pad 3. Thus, even when the electronic device 21 is subjected to vibration from the outside, it is possible to reduce the likelihood that the dust adheres between the plurality of electrode pads 3 and causes a short circuit between the plurality of electrode pads 3. Thus, it is possible to reduce the likelihood of malfunction of the electronic device 21.

The electronic element mounting substrate 1 includes the second frame body 2c located on the upper surface of the first frame body 2b and surrounding the electrode pad 3 and the mounting region 4. Here, when the electrode pad 3 is located on the upper surface of the first frame body 2b, as illustrated in FIG. 3, an inner edge of the second frame body 2c is located outside relative to an inner edge of the first frame body 2b in a plane perspective from above. Further, when the electrode pad 3 is located on the upper surface of the substrate 2a, as illustrated in FIG. 5, the inner edge of the second frame body 2c may be located at a position overlapping the inner edge of the first frame body 2b in a plane perspective from above, or the inner edge of the second frame body 2c may be located inside relative to the inner edge of the first frame body 2b in a plane perspective from above.

In the example illustrated in FIG. 4, in the electronic element mounting substrate 1, the electrode pad 3 is located on the upper surface of the first frame body 2b, and the channel 6 extending from the inner wall of the second frame body 2c to the outside is provided. In other words, the one end of the opening portion of the channel 6 is located above relative to the electrode pad 3 in a cross-sectional view. This makes it possible to reduce the amount of gas directly blown onto the wire 13 or to reduce the area in which the gas is blown onto the wire 13 in the step of injecting/discharging gas using the channel 6. Thus, it is possible to reduce the likelihood that the wire 13 is bent by the gas blown and a short circuit is caused between adjacent wires. Therefore, it is possible to reduce a decrease in the yield of the electronic device 21. Further, the structure of the present embodiment makes it possible to reduce the stress applied to the bonding portion between the electrode pad 3 and the wire 13. Thus, it is possible to suppress a decrease in the bonding strength between the electrode pad 3 and the wire 13 due to the stress by the gas.

In addition to the case of injecting/discharging gas through the channel, in the step of bonding the lid or the like when manufacturing the electronic device, there is a case in which only water vapor or the like is discharged so as not to accumulate the water vapor or the like inside the electronic device (gas is not intentionally injected/discharged). In this step, since the gas is not intentionally discharged, when, for example, the channel is in the same place as the electrode or in the vicinity of the electrode and dust or the like enters through the channel, the next step is performed with the dust remaining in the vicinity of the electrode. Thereafter, in a case where the electronic device is mounted on an external device and then vibration or the like is applied to the electronic device from the outside, there is a concern that dust located near the electrodes may move and cause a short circuit between the electrodes, thereby causing a malfunction.

In contrast, in the example illustrated in FIG. 4, since the one end of the opening portion of the channel 6 is located above relative to the electrode pad 3 in a cross-sectional view, the dust entering through the channel 6 is less likely to adhere to the vicinity of the electrode pad 3. Thus, even when the electronic device 21 is subjected to vibration from the outside, it is possible to reduce the likelihood that the dust adheres between the plurality of electrode pads 3 and causes a short circuit between the plurality of electrode pads 3. Thus, it is possible to reduce the likelihood of malfunction of the electronic device 21.

The electrode pad 3 of the electronic element mounting substrate 1 is located inside relative to the second frame body 2c, and the mounting region 4 is located inside relative to the electrode pad 3. In other words, the electrode pad 3 of the electronic element mounting substrate 1 and the electronic element 10 mounted on the mounting region 4 do not overlap each other in a plane perspective, and the electrode pad 3 is located on the upper surface of the first frame body 2b. As a result, it is possible to position the channel 6 above the electrode pad 3, and to position the end portion of the channel 6 inside relative to the end portion of the electrode pad 3 in a plane perspective. In the electronic element mounting substrate 1, since the electrode pad 3 is located on the upper surface of the first frame body 2b as in the example illustrated in FIG. 3, the position of the upper surface of the electronic element 10 mounted on the mounting region 4 and the position of the electrode pad 3 in a cross-sectional view can be set to substantially the same height position. Further, since the length of the wire 13 is short, the amount of deflection of the wire 13 can be reduced in the step of injecting/discharging gas using the channel 6. Thus, it is possible to reduce the likelihood that the wires 13 of the electrode pads 3 adjacent to each other come into contact with each other, which makes it possible to improve the effects of the present embodiment.

In addition, in the electronic element mounting substrate 1, since the electrode pad 3 is located on the upper surface of the substrate 2a as in the example illustrated in FIG. 5, the structure of the base body 2 is simplified, and then the yield can be improved. Further, the height of the wire 13 can be kept low, which makes it possible to reduce the height of the electronic element mounting substrate 1. Further, since the height of the wire 13 can be kept low, it is possible to reduce the area of the portion where the channel 6 and the wire 13 are located at substantially the same height in a cross-sectional view. Thus, it is possible to reduce the area where the gas is directly blown onto the wire 13 during the injecting/discharging of gas, which makes it possible to improve the effects of the present embodiment.

The second frame body 2c of the electronic element mounting substrate 1 includes a plurality of layers, and the channel 6 may be located above relative to the first layer from the bottom of at least the plurality of layers. This makes it possible to increase a distance from the electrode pad 3 to the channel 6 in a cross-sectional view. Thus, in the step of injecting/discharging gas using the channel 6, it is possible to reduce the amount of gas directly blown onto the wire 13 or to reduce the area in which the gas is blown onto the wire 13. Therefore, the effects of the present embodiment can be further improved.

The second frame body 2c of the electronic element mounting substrate 1 includes the plurality of layers, and the thickness of the channel 6 may be the thickness of at least one layer of the plurality of layers in a cross-sectional view. This makes it possible to inject/discharge gas more smoothly. Thus, since it is possible to inject/discharge gas without increasing the gas pressure, the amount of deflection of the wire 13 can be reduced. It is also possible to reduce the mixing of dust.

Configuration of Electronic Device

Examples of the electronic device 21 are illustrated in FIGS. 2 to 5. The electronic device 21 includes the electronic element mounting substrate 1 and the electronic element 10 mounted on the upper surface of the electronic element mounting substrate 1.

The electronic device 21 includes the electronic element mounting substrate 1 and the electronic element 10 mounted on the mounting region 4 of the substrate 2a of the electronic element mounting substrate 1. Examples of the electronic element 10 include, for example, an imaging element such as a charge coupled device (CCD) or a complementary metal oxide semiconductor (CMOS), a light emitting element such as a light emitting diode (LED), an element having a sensor function such as pressure, air pressure, acceleration, a gyroscope, or the like, and an integrated circuit. Note that the electronic element 10 may be disposed on the upper surface of the substrate 2a with an adhesive interposed therebetween. Examples of the adhesive include a silver epoxy and a thermosetting resin.

The electronic element 10 and the electronic element mounting substrate 1 may be electrically connected by, for example, the wire 13.

The electronic device 21 may include the lid 12 bonded to the upper surface of the electronic element mounting substrate 1 and covering the electronic element 10.

For example, when the electronic element 10 is an imaging element such as a CMOS or a CCD, or a light emitting element such as an LED, a material having high transparency such as a glass material may be used for the lid. Further, for example, when the electronic element 10 is an integrated circuit or the like, a metal material, a ceramic material, or an organic material may be used for the lid.

The lid 12 may be bonded to the electronic element mounting substrate 1 with a lid bonding member 14 interposed therebetween. Examples of materials for the lid bonding member 14 may include the thermosetting resin, a low melting point glass, and a brazing material made of a metal component.

Here, after the step of injecting/discharging gas or the step of bonding the lid 12 is completed, the channel 6 may be filled with resin or the like at the end portion located outside. This makes it possible to reduce the mixing of dust through the channel after the step of injecting/discharging gas or the step of bonding the lid 12. At this time, by applying a metal layer to the inner wall of the channel 6, sealing can be performed using, for example, the brazing material.

On the other hand, the channel 6 may be open after the process of manufacturing the electronic device 21. As a result, when the electronic device 21 is connected to an external device and is actually used by the user, it is possible to adjust the amount of moisture inside the electronic device 21, due to, for example, fluctuation in air pressure or temperature.

With the electronic device 21 including the electronic element mounting substrate 1 as illustrated in FIG. 2, it is possible to reduce the likelihood that the adjacent wires 13 come into contact with each other and cause a short circuit in the step of injecting/discharging gas into the channel 6, which makes it possible to reduce the decrease in the yield of the electronic device 21. Further, it is possible to reduce the likelihood that dust entering through the channel 6 is located between the plurality of electrode pads 3 and causes a short circuit, which makes it possible to reduce the likelihood of malfunction of the electronic device 21.

Manufacturing Method of Electronic Element Mounting Substrate and Electronic Device Next, an example of a manufacturing method of the electronic element mounting substrate 1 and the electronic device 21 according to the present embodiment will be described. Note that as the example of the manufacturing method, a manufacturing method of the base body 2 using a multipiece wiring board will be described below.

(1) First, ceramic green sheets configuring the base body 2 (the substrate 2a, the first frame body 2b, and the second frame body 2c) are formed. For example, in order to obtain the base body 2 made of an aluminum oxide ($Al_2O_3$) sintered compact, powder such as silica ($SiO_2$), magnesia (MgO), or calcia (CaO) is added as a sintering aid to $Al_2O_3$ powder. Further, a suitable binder, a solvent, and a plasticizer are added, and then a mixture thereof is kneaded to form a slurry. Then, multipiece ceramic green sheets are obtained by a formation method, such as a doctor blade method or a calender roll method.

Note that when the base body 2 is made of resin, for example, the base body 2 can be formed by a transfer molding method, an injection molding method, pressing with a metal mold, or the like using a metal mold capable of forming the resin into a predetermined shape. Further, the material of the base body 2 may be a base material made of glass fibers impregnated with resin, such as a glass epoxy resin. In this case, the base body 2 can be formed by impregnating a base material made of glass fibers with an epoxy resin precursor and thermally curing the epoxy resin precursor at a predetermined temperature.

(2) Subsequently, the aforementioned green sheets are processed using a metal mold or the like. Here, the opening portions are formed in the first frame body 2b and the second frame body 2c. In addition, when the base body 2 has the cutout section or the like, the cutout section or the like may be similarly formed at a predetermined portion of the green sheet to be the base body 2. Further, in this step, a through-hole to be the channel 6 may be formed in the green sheet to be the first frame body 2b or the second frame body 2c using a metal mold, a laser, or the like.

(3) Subsequently, the ceramic green sheets to be respective insulating layers of the base body 2 are laminated and pressurized. In this way, the ceramic green sheets to be insulating layers may be laminated to produce a ceramic green sheet laminated body to be the base body 2 (the electronic element mounting substrate 1). Note that at this time, a portion to be the cutout section or the like may be appropriately produced by a metal mold or the like.

(4) Subsequently, by a screen printing method or the like, a metal paste is applied to or filled in portions of the ceramic green sheets or the ceramic green sheet laminated body obtained in the above-described steps (1) to (3) that become the electrode pad 3, the external circuit connection electrode, the internal wiring electrical conductor, and the through-hole conductor. This metal paste is created so as to have appropriate viscosity by adding a suitable solvent and binder to the metal powder formed of the above-described metal materials, and kneading the mixture. Note that glass or ceramic may also be contained in the metal paste in order to increase the bonding strength with the base body 2.

Further, when the base body 2 is made of resin, the electrode pad 3, the external circuit connection electrode, the internal wiring electrical conductor, and the through-hole conductor can be manufactured by sputtering, vaporizing, or the like. Furthermore, the base body 2 is made of resin, the electrode pad 3, the external circuit connection electrode, the internal wiring conductor, and the through-hole conductor may be manufactured by using a plating method after providing a metal film on the surface.

(5) Subsequently, split grooves may be provided at predetermined positions on the green sheet by using a metal mold, punching, a laser, or the like. Note that the split grooves can be formed by notching the multipiece wiring board shallower than the thickness thereof using a slicing device after firing. However, the split grooves may be formed by pressing a cutter blade against the ceramic green sheet laminated body for the multipiece wiring board, or by notching the ceramic green sheet laminated body shallower than the thickness thereof using a slicing device.

(6) Subsequently, the ceramic green sheet laminated body is fired at a temperature of approximately 1500° C. to 1800° C. to obtain the multipiece wiring board, which includes a plurality of the arranged base bodies 2 (the electronic element mounting substrates 1). Note that, in this step, the above-described metal paste is fired at the same time as the ceramic green sheets forming the base body 2 (the electronic element mounting substrate 1), and forms the electrode pad 3, the external circuit connection electrode, the internal wiring electrical conductor, and the through-hole conductor.

(7) Subsequently, the multipiece wiring board obtained by the firing is divided into the plurality of the individual base bodies 2 (the electronic element mounting substrates 1). In this division, there is a method of dividing the multipiece wiring board into the plurality of the individual base bodies 2 by breaking along the split grooves that are formed on the multipiece wiring board along the portions becoming the outer edges of the base bodies 2 (the electronic element mounting substrates 1) in step (5). In addition, there is also a method of cutting along the portions becoming the outer edges of the base bodies 2 (the electronic element mounting substrates 1) by slicing or the like without performing step (5). Note that before or after dividing the multipiece wiring board into the plurality of the individual base bodies 2 (electronic element mounting substrates 1), the plating may be applied to the electrode pad 3, the external connection pad, and the exposed wiring conductor using electrolytic or electroless plating method, respectively.

(8) Subsequently, the electronic element 10 is mounted on the electronic element mounting substrate 1. The electronic element 10 is electrically connected to the electronic element mounting substrate 1 with the wire 13. At this time, an adhesive or the like may be provided on the electronic element 10 or the electronic element mounting substrate 1 to fix the electronic element 10 to the electronic element mounting substrate 1. In addition, after the electronic element 10 is mounted on the electronic element mounting substrate 1, the lid 12 may be bonded to the electronic element mounting substrate 1 with the lid bonding member 14. At this time, after bonding the lid 12, an appropriately selected gas may be injected/discharged inside the electronic device 21 using the channel 6.

The electronic device 21 can be manufactured by manufacturing the electronic element mounting substrate 1 as described in steps (1) to (7) and mounting the electronic element 10 on the electronic element mounting substrate 1. Note that the order of the above-described steps (1) to (8) can be changed to another order that can be processed. In addition to the process described above, the electronic element mounting substrate 1 can also be manufactured by using, for example, a 3D printer or the like.

Second Embodiment

The electronic element mounting substrate 1 and the electronic device 21 provided with the electronic element mounting substrate 1 according to a second embodiment of the present disclosure will be described with reference to FIG. 6. One difference from the first embodiment is the shape of the cutout section 7 of the substrate 2a.

Figure 6A:
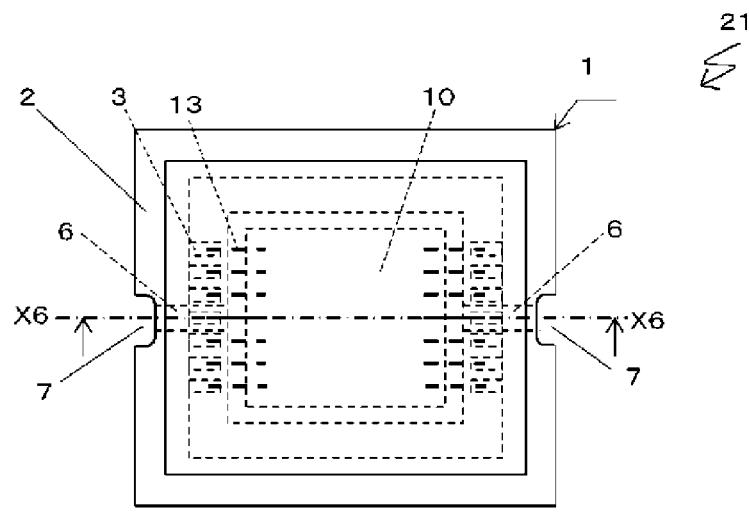
FIG. 6A is a top view illustrating an outer appearance of an electronic element mounting substrate and an electronic device according to an aspect of a second embodiment of the present disclosure.
Figure 6B:
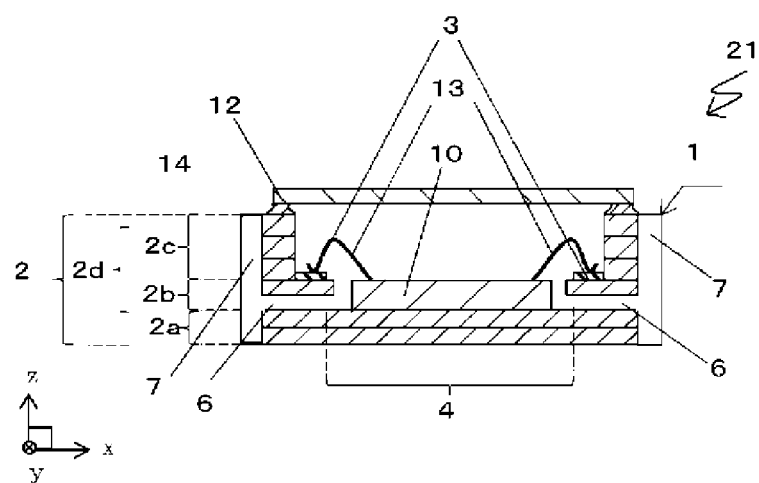
FIG. 6B is a longitudinal cross-sectional view corresponding to a line X6-X6 in FIG. 6A.

In the example illustrated in FIG. 6, the cutout section 7 has a channel shape or a U shape. Since the cutout section 7 has the channel shape or the U shape, the area of an opening portion at an outer end portion of the channel 6 is more easily maintained compared with the semicircular cutout section 7 as in the example illustrated in FIG. 2. Thus, it is possible to reduce failure when injecting/discharging gas using the channel 6. In addition, in the example illustrated in FIG. 6, the cutout section 7 can be made sufficiently large for the channel 6. As a result, even when a position shift occurs, the position of the channel 6 can be kept within the range of the cutout section 7. Thus, it is possible to reduce failure when injecting/discharging gas inside the recessed portion 20 caused by the position shift of the channel 6 to the cutout section 7. As described above, the same effects as when the position shift does not occur can be obtained.

Manufacturing Method of Electronic Element Mounting Substrate and Electronic Device Next, an example of a manufacturing method of the electronic element mounting substrate 1 and the electronic device 21 according to the present embodiment will be described. The manufacturing method of the electronic element mounting substrate 1 and the electronic device 21 of the present embodiment is basically similar to the manufacturing method described in the first embodiment. In the manufacturing method according to the present embodiment, the electronic element mounting substrate 1 can be manufactured by changing a portion at which the cutout section 7 is formed in the step described in the first embodiment.

Third Embodiment

The electronic element mounting substrate 1 and the electronic device 21 provided with the electronic element mounting substrate 1 according to a third embodiment of the present disclosure will be described with reference to FIGS. 7 and 8. One difference from the first embodiment is that the size of the cutout section 7 of the substrate 2a in a Z direction is different in a longitudinal cross-sectional view. In the examples illustrated in FIGS. 7 and 8, the cutout section 7 has a small size in the Z direction and is disposed only in a lower surface direction. As a result, the cutout section 7 does not appear in a plane perspective of the electronic element mounting substrate 1 and the electronic device 21 provided with the electronic element mounting substrate 1. Thus, it is possible to reduce the likelihood of entraining dust falling from an upward direction of the electronic element mounting substrate 1 and the electronic device 21 provided with the electronic element mounting substrate 1.

The external shape of the electronic element mounting substrate 1 and the electronic device 21 provided with the electronic element mounting substrate 1 in a top view is a quadrilateral without the cutout section 7. In other words, there is no cutout section 7 in a top layer. As a result, it is possible to reduce concentration of damage during handling and the like in the vicinity where the cutout section 7 is disposed, which makes it possible to reduce failure in the electronic element mounting substrate 1.

Figure 7A:
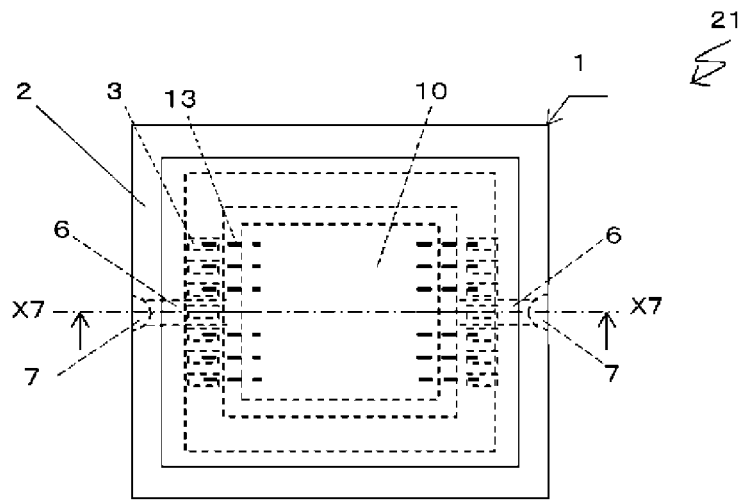
FIG. 7A is a top view illustrating an outer appearance of an electronic element mounting substrate and an electronic device according to a third embodiment of the present disclosure.
Figure 7B:
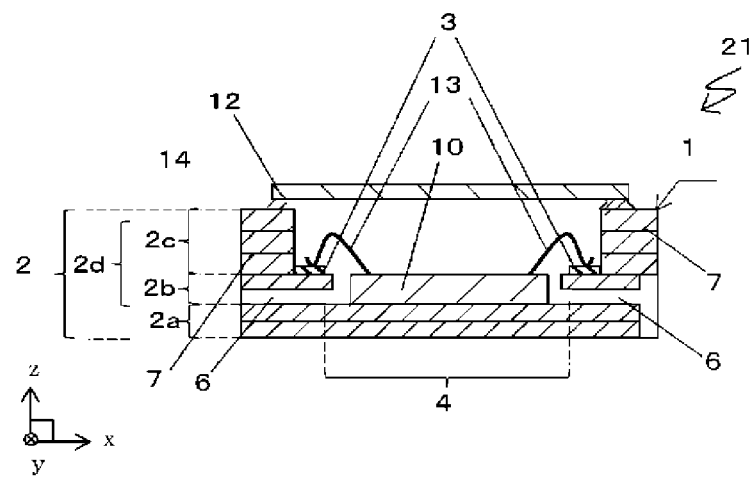
FIG. 7B is a longitudinal cross-sectional view corresponding to a line X7-X7 in FIG. 7A.
Figure 8A:
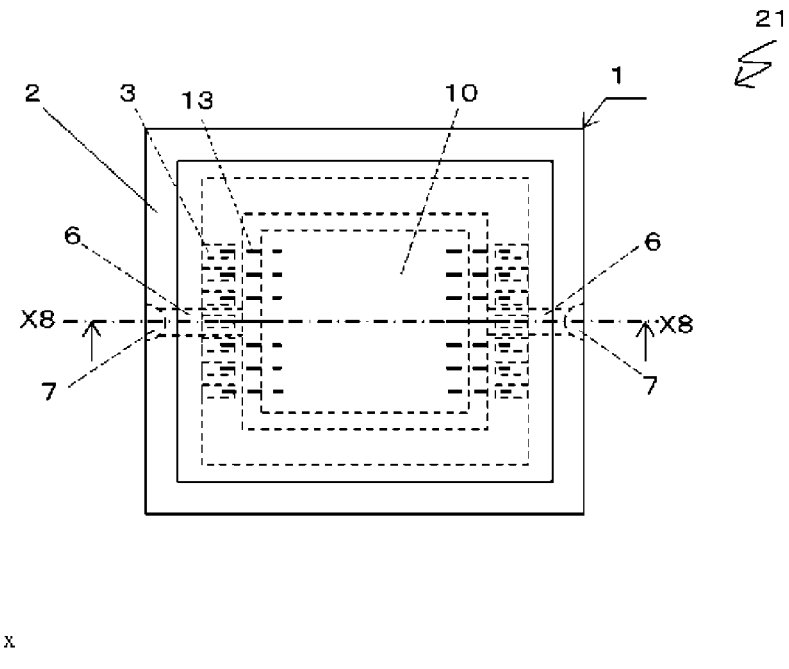
FIG. 8A is a top view illustrating an outer appearance of an electronic element mounting substrate and an electronic device according to another aspect of the third embodiment of the present disclosure.
Figure 8B:
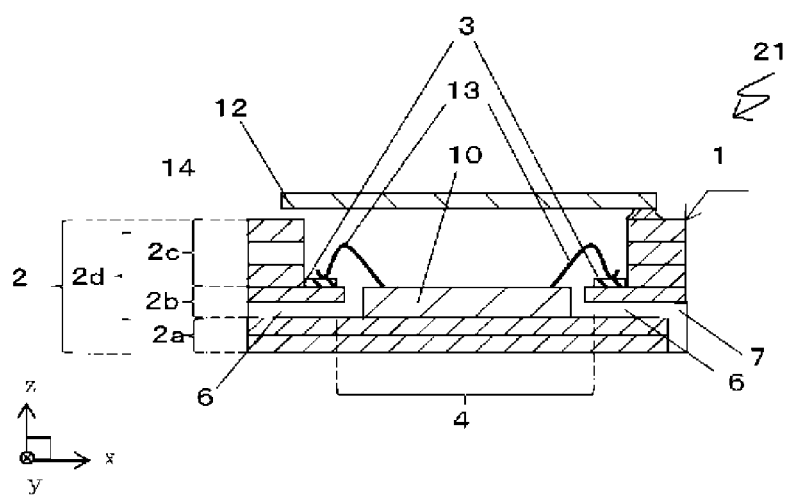
FIG. 8B is a longitudinal cross-sectional view corresponding to a line X8-X8 in FIG. 8A.

In the example illustrated in FIG. 7 and the example illustrated in FIG. 8, a positional relationship between the channel 6 and the cutout section 7 is different. In the example illustrated in FIG. 7, the cutout section 7 is formed up to an upper side of the channel 6 in a cross-sectional view, but in the example illustrated in FIG. 8, the cutout section 7 is formed up to the same position as the channel 6 in a cross-sectional view. In the example illustrated in FIG. 7, since the cutout section 7 is formed up to the upper side of the channel 6 in the cross-sectional view, it is possible to maintain the channel 6 even when the electronic element mounting substrate 1 is deformed and bent downward at the upper portion of the cutout section 7. When the cutout section 7 is formed up to the same position as the channel 6 in the cross-sectional view as in the example illustrated in FIG. 8, in a case in which a tool such as a nozzle is used for injecting/discharging gas, it is possible to easily align the nozzle with the channel 6 at an opening portion of the channel 6, which makes it possible to reduce the likelihood of capturing dust when injecting gas. At this time, the effects of the present disclosure is further obtained when the shapes of the plurality of channels 6 are the same.

Manufacturing Method of Electronic Element Mounting Substrate and Electronic Device Next, an example of a manufacturing method of the electronic element mounting substrate 1 and the electronic device 21 according to the present embodiment will be described. The manufacturing method of the electronic element mounting substrate 1 and the electronic device 21 of the present embodiment is basically similar to the manufacturing method described in the first embodiment. In the manufacturing method according to the present embodiment, the electronic element mounting substrate 1 can be manufactured by changing portions in the Z direction at which the cutout section 7 is formed in the step described in the first embodiment.

Fourth Embodiment

The electronic element mounting substrate 1 and the electronic device 21 provided with the electronic element mounting substrate 1 according to a fourth embodiment of the present disclosure will be described with reference to FIGS. 9 to 11. Note that FIG. 11 illustrates a top surface view of the electronic element mounting substrate 1. The examples illustrated in FIGS. 9 and 10 are different from the first embodiment in that the channel 6 spans two layers.

Figure 9A:
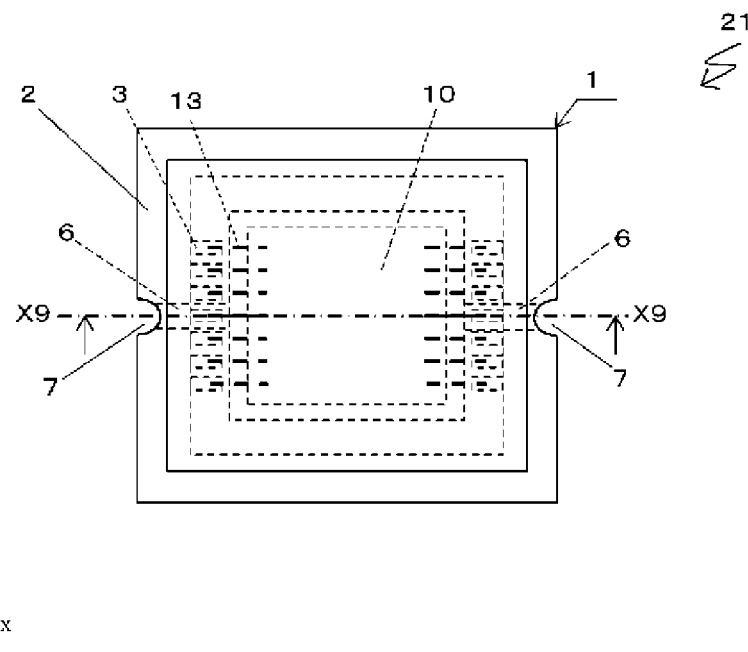
FIG. 9A is a top view illustrating an outer appearance of an electronic element mounting substrate and an electronic device according to an aspect of a fourth embodiment of the present disclosure.
Figure 9B:
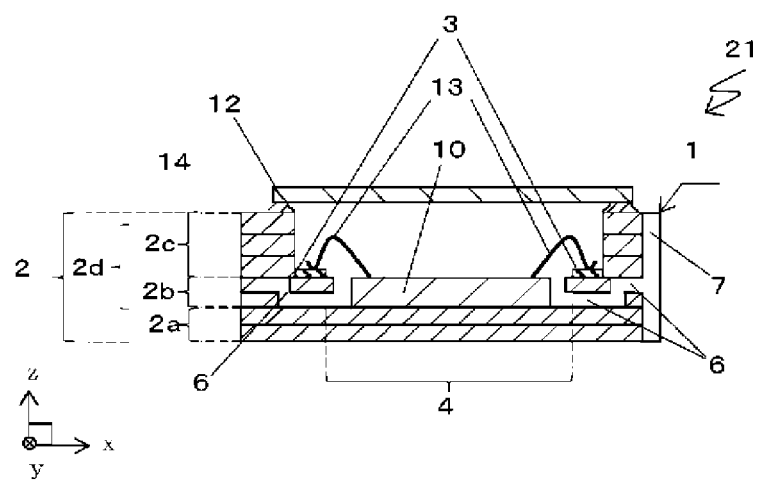
FIG. 9B is a longitudinal cross-sectional view corresponding to a line X9-X9 in FIG. 9A.
Figure 10A:
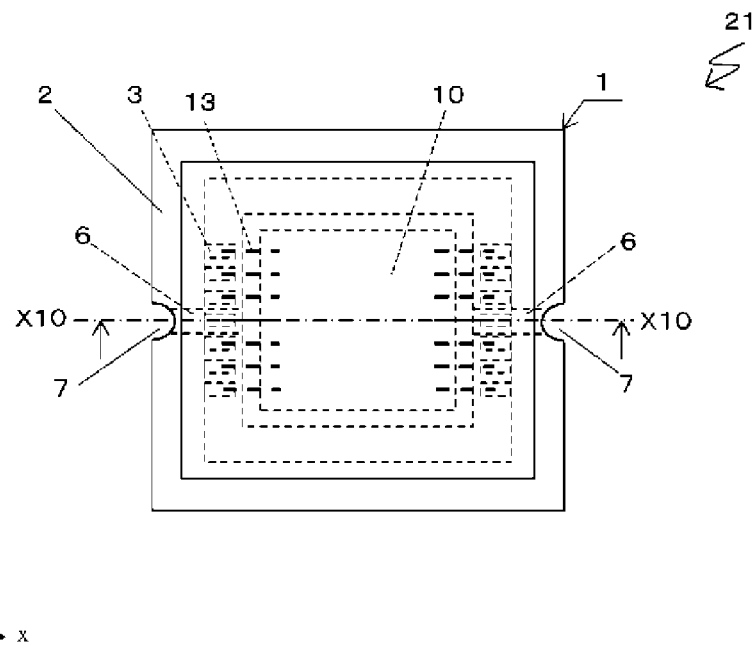
FIG. 10A is a top view illustrating an outer appearance of an electronic element mounting substrate and an electronic device according to another aspect of the fourth embodiment of the present disclosure.
Figure 10B:
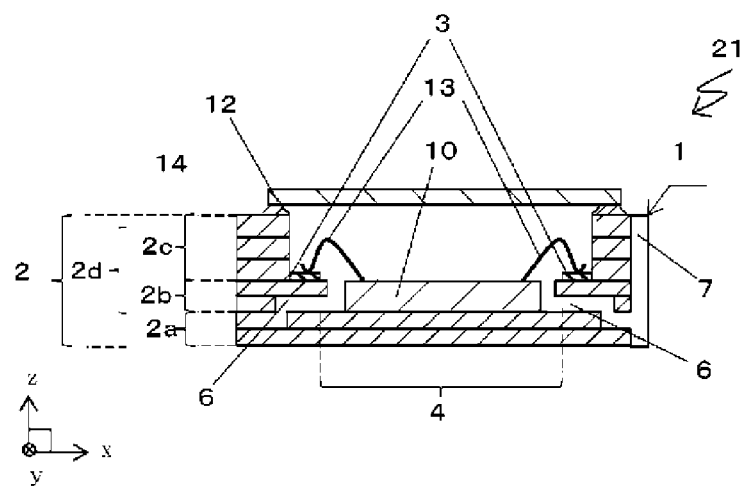
FIG. 10B is a longitudinal cross-sectional view corresponding to a line X10-X10 in FIG. 10A.

In the examples illustrated in FIGS. 9 and 10, the channel 6 spans two layers and has a shape that is bent vertically in a longitudinal cross-sectional view. As a result, even when dust enters from an outer end portion of the channel 6, the dust can be trapped at a bent portion of the channel 6, which makes it possible to reduce the movement of the dust to an inner end portion of the channel 6 or an inside of the electronic device 21. Accordingly, it is possible to reduce the likelihood of dust adhering to the electrode pad 3 or of dust adhering between the plurality of electrode pads 3 and causing a short circuit.

A bending direction of the channel 6 is different between the example illustrated in FIG. 9 and the example illustrated in FIG. 10. In the example illustrated in FIG. 9, a position of the channel 6 of the first frame body 2b is higher than a position of the channel 6 in a cross-sectional view. Since the position of the channel 6 of the first frame body 2b is high in the cross-sectional view, it is possible to reduce the entrainment of dust. Accordingly, by reducing the entrainment of dust into the recessed portion 20, it is possible to reduce the likelihood of dust adhering to the electrode pad 3 or of dust adhering between the plurality of electrode pads 3 and causing a short circuit. Therefore, the effects of the present disclosure can be further improved.

In the example illustrated in FIG. 10, the position of the channel 6 of the first frame body 2b is low in a cross-sectional view. As a result, the entrained dust in the recessed portion 20 can be easily discharged. By reducing the dust in the recessed portion 20, it is possible to reduce the likelihood of similar dust adhering to the electrode pad 3 or of dust adhering between the plurality of electrode pads 3 and causing a short circuit. Therefore, the effects of the present disclosure can be further improved. In addition to the case of injecting/discharging gas through the channel 6, in the step of bonding the lid 12 or the like when manufacturing the electronic device 21, there is a case in which only water vapor or the like is discharged so as not to accumulate inside the electronic device 21, that is, gas is not intentionally injected/discharged. As in the example illustrated in FIG. 10, the position of the channel 6 of the first frame body 2b is lower than the position of the channel 6 in the cross-sectional view, so that the dust is easily discharged from the recessed portion 20 even when the gas is not intentionally discharged. This makes it possible to reduce the likelihood of dust adhering to the electrode pad 3 or of dust adhering between the plurality of electrode pads 3 and causing a short circuit.

Note that in the examples illustrated in FIGS. 9 and 10, the channel 6 spans two layers, but may span three or more layers, whereby the same effects as described above can be obtained. In the example illustrated in FIG. 11, the channel 6 has a bent shape in a plane perspective. The example illustrated in FIG. 11 is different from the example illustrated in FIG. 2 of the first embodiment in that the channel 6 is bent in the same plane. As a result, even when dust enters from the outer end portion of the channel 6, the dust can be trapped at a bent portion of the channel 6, which makes it possible to reduce the movement of the dust to the inner end portion of the channel 6 or the inside of the electronic device 21. Accordingly, it is possible to reduce the likelihood of dust adhering to the electrode pad 3 or of dust adhering between the plurality of electrode pads 3 and causing a short circuit.

Figure 11A:
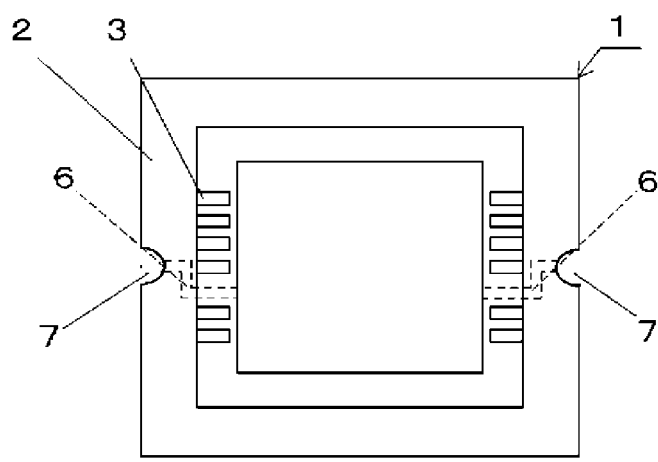
FIG. 11A and FIG. 11B are top views illustrating outer appearances of an electronic element mounting substrate according to still another aspect of the fourth embodiment of the present disclosure BA.
Figure 11A:
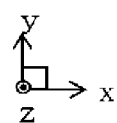
Figure 11B:
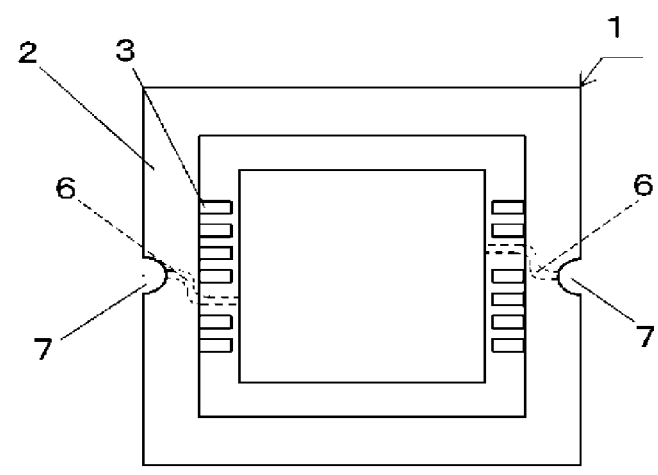
Figure 11B:
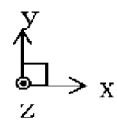

In FIG. 11B, each bent portion of the channel 6 has a curved surface (arc). As a result, for example, in the step of injecting/discharging gas, the gas can be more easily injected/discharged without stagnation even at the bent portion of the channel 6. As a result, it is possible to inject/discharge gas without increasing gas pressure, which makes it possible to reduce the amount of deflection of the wire 13, and to reduce the mixing of dust. As illustrated in FIG. 11, the channel 6 is bent in the same plane. As a result, it is possible to reduce the likelihood of dust adhering to the electrode pad 3 or of dust adhering between the plurality of electrode pads 3 and causing a short circuit.

The vertical bent portions as in the example illustrated in FIG. 9 and the example illustrated in FIG. 10 and the bent portion in the same plane as in the example illustrated in FIG. 11 can be provided together with the electronic element mounting substrate 1 and the electronic device 21 provided with the electronic element mounting substrate 1. In this case, it is possible to further reduce the dust in the recessed portion 20, which makes it possible to reduce the likelihood of dust adhering to the electrode pad 3 or of dust adhering between the plurality of electrode pads 3 and causing a short circuit.

Manufacturing Method of Electronic Element Mounting Substrate and Electronic Device Next, an example of a manufacturing method of the electronic element mounting substrate 1 and the electronic device 21 according to the present embodiment will be described. The manufacturing method of the electronic element mounting substrate 1 and the electronic device 21 of the present embodiment is basically similar to the manufacturing method described in the first embodiment. In the manufacturing method according to the present embodiment, the electronic element mounting substrate 1 can be manufactured by changing a portion at which the channel 6 is formed in the step described in the first embodiment.

Fifth Embodiment

The electronic element mounting substrate 1 according to a fifth embodiment of the present disclosure will be described with reference to FIG. 12. FIG. 12 illustrates a top surface view of the electronic element mounting substrate 1.

Figure 12A:
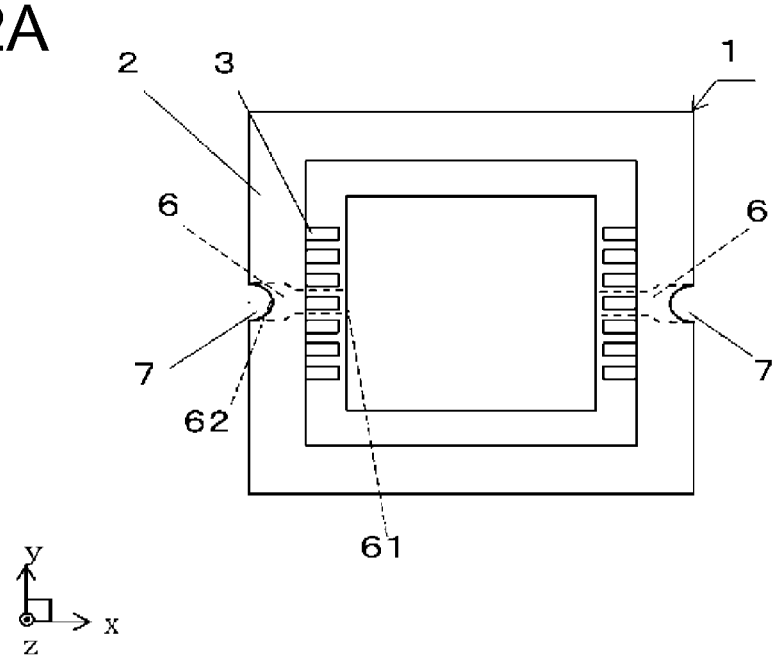
FIGS. 12A and 12B are top views illustrating outer appearances of electronic element mounting substrates according to an aspect of a fifth embodiment of the present disclosure.

One difference between the example illustrated in FIG. 12A and the example illustrated in FIG. 2 of the first embodiment is the shape of the channel 6. Specifically, the width of the channel 6 varies depending on a place of the channel 6. The plurality of channels 6 are larger at an outer end portion than at an inner wall side end portion of the first frame body 2b or the second frame body 2c in a plane perspective. With such a configuration, dust is less likely to be mixed from the outer end portion of the channel 6. Thus, it is possible to reduce the likelihood that the dust entering through the channel 6 is located between the plurality of electrode pads 3 and causes a short circuit. Further, when the channel 6 is located between the first frame body 2b and the substrate 2a, the channel 6 may have a linear section in the vicinity of an inner wall of the first frame body 2b. As a result, it is possible to further reduce the mixing of the dust, which makes it possible to improve the effect of reducing the likelihood that the dust through the channel 6 is located between the plurality of electrode pads 3 and causes a short circuit.

Figure 12B:
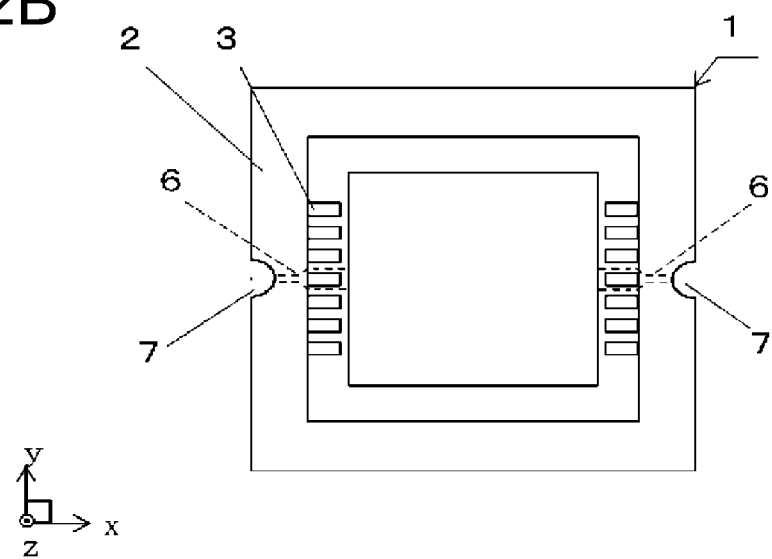

In the example illustrated in FIG. 12B, the plurality of channels 6 are smaller at the outer end portion than at the inner wall side end portion of the first frame body 2b in a plane perspective. As a result, gas injected using the channel 6 can be diffused over a wide range, which makes it possible to reduce force of the gas in the vicinity of the inner end portion of the channel 6. Thus, the amount of deflection of the wire 13 can be reduced. This makes it possible to reduce the likelihood that the wires 13 come into contact with each other and cause a short circuit.

Note that when the channel 6 is located between the first frame body 2b and the substrate 2a, the channel 6 may have the linear section in the vicinity of the inner wall of the first frame body 2b. As a result, gas injected using the channel 6 can be diffused over a wide range, which makes it possible to reduce the force of the gas in the vicinity of the inner end portion of the channel 6, and further separate the end portion of the channel 6 from the electrode pad 3. Thus, it is possible to reduce the amount of deflection of the wire 13 and to reduce the likelihood that the dust entering through the channel 6 is located between the plurality of electrode pads 3 and causes a short circuit.

Manufacturing Method of Electronic Element Mounting Substrate and Electronic Device Next, an example of a manufacturing method of the electronic element mounting substrate 1 and the electronic device 21 according to the present embodiment will be described. The manufacturing method of the electronic element mounting substrate 1 and the electronic device 21 of the present embodiment is basically similar to the manufacturing method described in the first embodiment. In the manufacturing method according to the present embodiment, the electronic element mounting substrate 1 can be manufactured by changing a portion at which the channel 6 is formed in the step described in the first embodiment.

Sixth Embodiment

Figure 13:
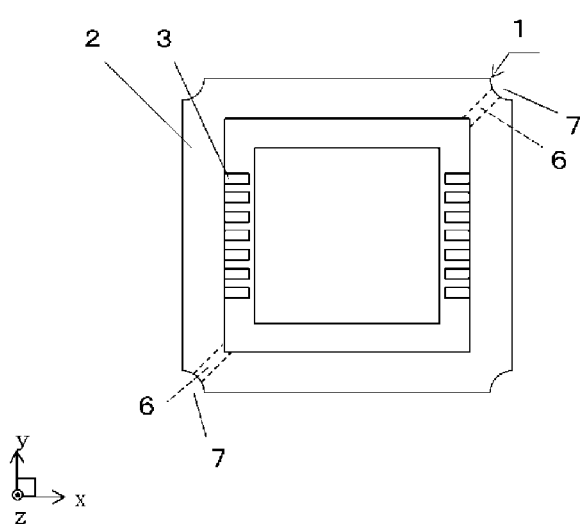
FIG. 13 is a top view illustrating an outer appearance of an electronic element mounting substrate according to an aspect of a sixth embodiment of the present disclosure.

The electronic element mounting substrate 1 according to a sixth embodiment of the present disclosure will be described with reference to FIG. 13. FIG. 13 illustrates a top surface view of the electronic element mounting substrate 1.

The example illustrated in FIG. 13 is different from the first embodiment in that the cutout section 7 is located at a corner portion of the base body 2, and the electrode pad 3 and the channel 6 are located so as not overlap each other in a plane perspective. When handling the electronic element mounting substrate and the electronic device provided with the electronic element mounting substrate, impact or pressure may be applied to the corner portion thereof. There is a concern of failure due to damage such as chipping of the substrate by the impact or the stress applied to the corner portion. In contrast, since the cutout section 7 is located at the corner portion of the base body 2, it is possible to release the impact or the stress applied to the corner portion, and it is possible to reduce dust generated by the impact or stress. In addition, since the electrode pad 3 and the channel 6 are located so as not to overlap each other, it is possible to reduce the likelihood that the adjacent wires 13 come into contact with each other and cause a short circuit in the step of injecting/discharging gas into the channel 6 and to reduce the likelihood that the dust entering through the channel 6 is located between the plurality of electrode pads 3 and causes a short circuit. Thus, it is possible to reduce the likelihood of malfunction of the electronic device 21 while improving the yield of the electronic element mounting substrate 1. In addition, in a case where the electronic element mounting substrate 1 has a structure in which the electrode pad 3 is not located in the vicinity of one end of the channel 6 (on a virtual vertical line) as in the example illustrated in FIG. 13, even when the dust enters through the channel 6, since the one end of the channel 6 is located away from the electrode pad 3, it is possible to reduce the likelihood of dust adhering to the electrode pad 3 or of dust adhering between the plurality of electrode pads 3 and causing a short circuit. Therefore, the effects of the present disclosure can be further improved. In addition, since the electronic element mounting substrate 1 has the structure in which the electrode pad 3 is not located in the vicinity of the one end of the channel 6 (on the virtual vertical line), it is possible to reduce the amount of gas blown onto the electrode pad 3 when injecting/discharging gas.

Manufacturing Method of Electronic Element Mounting Substrate and Electronic Device Next, an example of a manufacturing method of the electronic element mounting substrate 1 and the electronic device 21 according to the present embodiment will be described. The manufacturing method of the electronic element mounting substrate 1 and the electronic device 21 of the present embodiment is basically similar to the manufacturing method described in the first embodiment. In the manufacturing method according to the present embodiment, the electronic element mounting substrate 1 can be manufactured by changing portions at which the channel 6 and the cutout section 7 are formed in the step described in the first embodiment.

Seventh Embodiment

Figure 14:
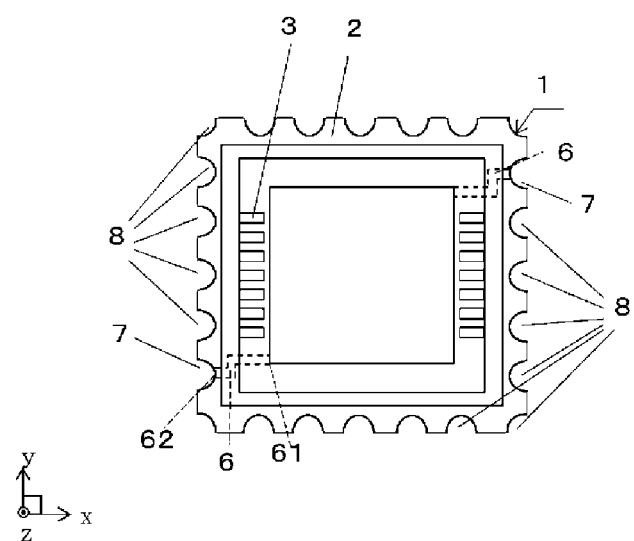
FIG. 14 is a top view illustrating an outer appearance of an electronic element mounting substrate according to an aspect of a seventh embodiment of the present disclosure.

The electronic element mounting substrate 1 according to a seventh embodiment of the present disclosure will be described with reference to FIGS. 14 to 16. Note that FIGS. 14 to 16 illustrates a top surface view of the electronic element mounting substrate 1.

The electronic element mounting substrate 1 according to the present embodiment is different from the electronic element mounting substrate 1 according to the first embodiment in that the base body 2 includes a plurality of groove portions 8 on an outer periphery thereof. Note that the groove portion 8 may have a semicircular shape or a semi-elliptical shape.

In a case in which the channel 6 is provided in the groove portion 8 on the outer periphery of the base body 2, when connecting and fixing the groove portion 8 on the outer periphery of the base body 2 as an external terminal to an external circuit with a conductive connecting material such as solder, the channel 6 can be simultaneously sealed with a conductive joining material.

Figure 15A:
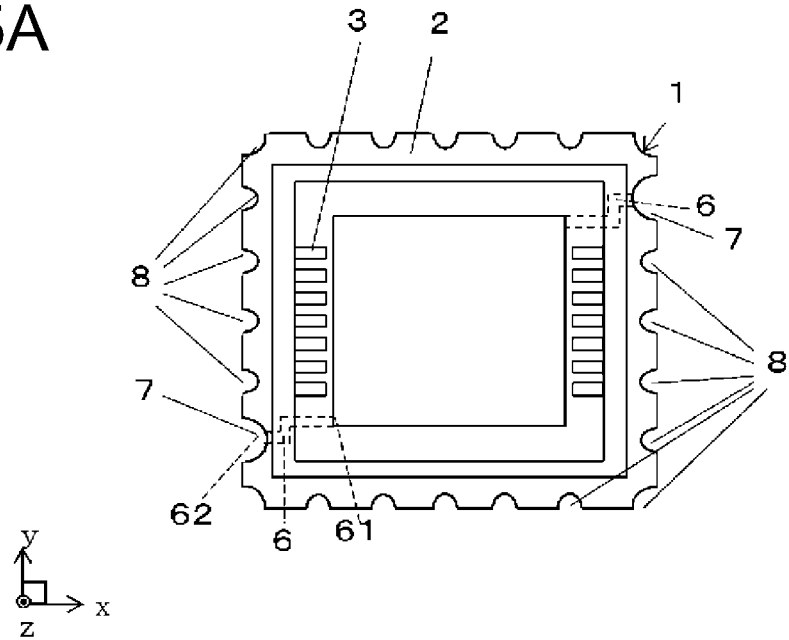
FIGS. 15A and B are top views illustrating electronic element mounting substrates according to another aspect of the seventh embodiment of the present disclosure.
Figure 16:
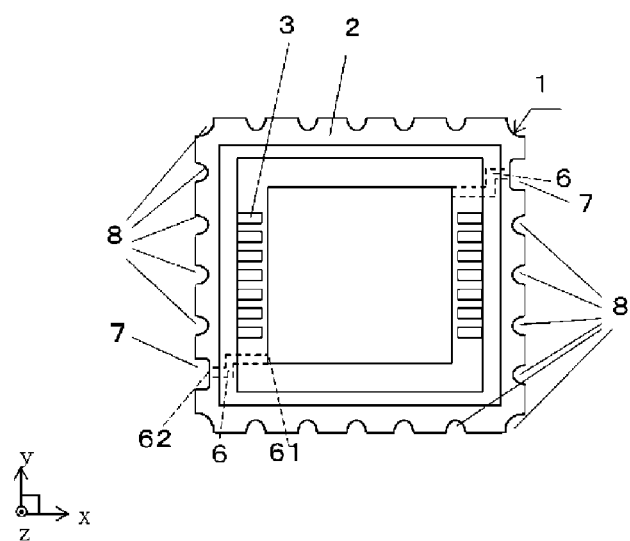
FIG. 16 is a top view illustrating an electronic element mounting substrate according to still another aspect of the seventh embodiment of the present disclosure.

In FIG. 15A, the electronic element mounting substrate 1 has the groove portion 8 on the outer periphery thereof, and the cutout section 7 is larger than the groove portion 8 in a plan view or in a plane perspective. Since the cutout section 7 is larger than the groove portion 8, the groove portion 8 can be easily distinguished from the cutout section 7 in which a channel is provided. Further, alignment or the like is facilitated when injecting/discharging gas inside the recessed portion 20. The sizes may be compared in a plan view or a plane perspective. Additionally, a plurality of the groove portions 8 may be provided.

Figure 15B:
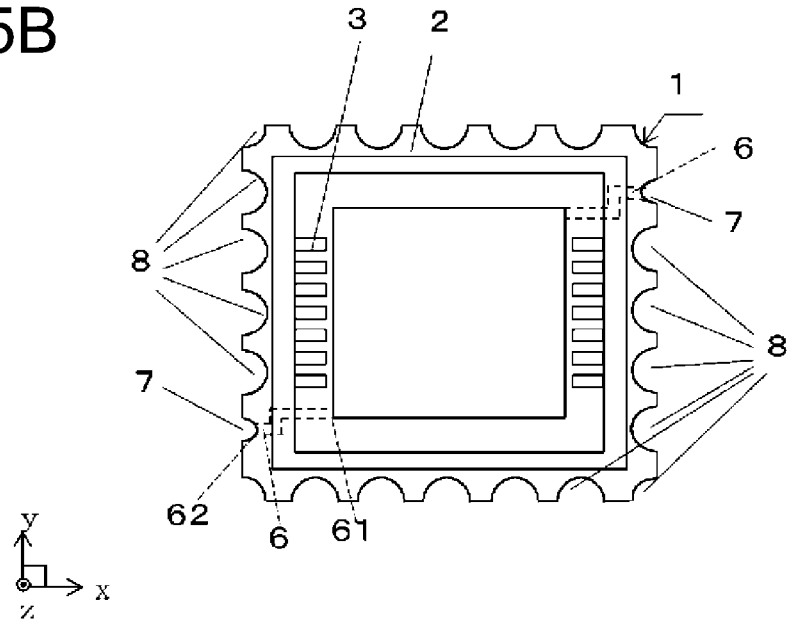

In FIG. 15B, the electronic element mounting substrate 1 has the groove portion 8 on the outer periphery thereof, and the cutout section 7 is smaller than the groove portion 8 in a plan view or a plane perspective. Since the cutout section 7 is smaller than the groove portion 8, the groove portion 8 can be easily distinguished from the cutout section 7 in which the channel 6 is provided. In addition, since the size of the cutout section 7 is small, it is easy for the conductive joining material to crawl up toward an upper surface of the base body 2. Accordingly, when connecting and fixing the groove portion 8 on the outer periphery of the base body 2 as an external terminal to an external circuit with a conductive connecting material such as solder, the channel 6 can be simultaneously sealed with the conductive joining material. Additionally, a plurality of the groove portions 8 may be provided.

In FIG. 16, the electronic element mounting substrate 1 has the groove portion 8 on the outer periphery thereof, and the cutout section 7 has a shape different from that of the groove portion 8. Since the cutout section 7 has a shape different from that of the groove portion 8, it is easy to distinguish the cutout section 7 from the groove portion 8. In addition, directionality can be easily determined as compared with the difference in size, and it is possible to reduce a process load. Additionally, a plurality of the groove portions 8 may be provided.

Manufacturing Method of Electronic Element Mounting Substrate and Electronic Device Next, an example of a manufacturing method of the electronic element mounting substrate 1 and the electronic device 21 according to the present embodiment will be described. The manufacturing method of the electronic element mounting substrate 1 and the electronic device 21 of the present embodiment is basically similar to the manufacturing method described in the first embodiment. In the manufacturing method according to the present embodiment, the electronic element mounting substrate 1 can be manufactured by changing portions at which the channel 6 and the cutout section 7 are formed and a portion to be the groove portion 8 is added in the step described in the first embodiment.

The present disclosure is not limited to the above-described embodiments, and various modifications can be made to numerical values and the like. Further, for example, in the examples illustrated in the respective figures, the shape of the electrode pad 3 is rectangular in a top view, but it may be circular or another polygonal shape. The arrangement, number, and shape of the electrode pad 3, the mounting method of the electronic element, and the like in the above-described embodiments are not specified. Note that, various combinations of feature portions in the above-described embodiments are not limited to the examples of the above-described embodiments. Further, the combinations of the respective embodiments are also possible.

REFERENCE SIGNS LIST

1 Electronic element mounting substrate
2 Base body
2a Substrate
2b First frame body
2c Second frame body
2d Frame body
20 Recessed portion
3 Electrode pad
4 Mounting region
6 Channel
61 Inner end portion
62 Outer end portion
7 Cutout section
8 Groove portion
10 Electronic element 12 Lid
13 Wire (connection conductor)
14 Lid bonding member
21 Electronic device

The invention claimed is:

1. An electronic element mounting substrate comprising:
a base body having a recessed portion including a mounting region on which an electronic element is mounted, and a cutout section located on an outer periphery of the base body; and
a channel having an inner end portion located on an inner wall of the base body and an outer end portion located on the outer periphery of the base body, wherein
the channel at least partially constitutes a through hole formed in the base body,
the through hole extends in a direction that intersects with an opening direction of the recessed portion, and
the inner end portion of the channel is open to the recessed portion, and the outer end portion of the channel is continuous with the cutout section to thereby maintain a passage for the flow of gas through the channel between the cut out section and the recessed portion after the recessed portion is sealingly covered with the electronic element mounted therein.

2. The electronic element mounting substrate according to claim 1, wherein the cutout section is located at a corner portion of the base body in a plane perspective.

3. The electronic element mounting substrate according to claim 1, wherein the base body includes
a substrate having an upper surface that includes the mounting region and
a frame body located on the upper surface of the substrate and surrounding the mounting region.

4. The electronic element mounting substrate according to claim 3, wherein
the frame body includes
a first frame body located on the upper surface of the substrate and surrounding the mounting region and
a second frame body located on an upper surface of the first frame body and surrounding the mounting region, and
the channel is rectangular in a cross-sectional view and is located between the substrate and the first frame body.

5. The electronic element mounting substrate according to claim 4, the electronic element mounting substrate further comprising:
an electrode pad located on the upper surface of the substrate or the upper surface of the first frame body, wherein
the channel is located above relative to the electrode pad.

6. The electronic element mounting substrate according to claim 5, wherein in a plane perspective, the mounting region is located inward of the electrode pad.

7. The electronic element mounting substrate according to claim 5, wherein, in a plane perspective, the electrode pad and the channel are located not overlapping each other.

8. The electronic element mounting substrate according to claim 1, wherein
the base body has a groove portion located on the outer periphery, and
in a plane perspective, an area of the cutout section is larger than an area of the groove portion.

9. The electronic element mounting substrate according to claim 1, wherein
the base body has a plurality of groove portions located on the outer periphery, and
the cutout section has a shape different from a shape of the plurality of groove portions in a plane perspective.

10. The electronic element mounting substrate according to claim 1, wherein
the base body has a groove portion located on the outer periphery, and
in a plane perspective, an area of the cutout section is smaller than an area of the groove portion.

11. The electronic element mounting substrate according to claim 1, wherein
a plurality of the channels are provided, and
at least two of the plurality of the channels differ in height from a lower surface of the base body.

12. The electronic element mounting substrate according to claim 1, wherein
a plurality of the channels are provided, and
each of the plurality of the channels has the same shape.

13. The electronic element mounting according to claim 1, wherein
the channel has a portion that is bent in a plane perspective and/or a cross-sectional view, and
the portion has a curved surface.

14. An electronic device comprising:
the electronic element mounting substrate according to claim 1; and
an electronic element mounted on the mounting region.

15. The electronic element mounting substrate according to claim 2, wherein the base body includes
a substrate having an upper surface that includes the mounting region and
a frame body located on the upper surface of the substrate and surrounding the mounting region.

16. The electronic element mounting substrate according to claim 6, wherein, in a plane perspective, the electrode pad and the channel are located not overlapping each other.

17. The electronic element mounting substrate according to claim 2, wherein
the base body has a groove portion located on the outer periphery, and
in a plane perspective, an area of the cutout section is larger than an area of the groove portion.

18. The electronic element mounting substrate according to claim 2, wherein
the base body has a plurality of groove portions located on the outer periphery, and
the cutout section has a shape different from a shape of the plurality of groove portions in a plane perspective.

19. The electronic element mounting substrate according to claim 2, wherein
the base body has a groove portion located on the outer periphery, and
in a plane perspective, an area of the cutout section is smaller than an area of the groove portion.

20. An electronic device comprising:
the electronic element mounting substrate according to claim 2;
an electronic element mounted on the mounting region; and
a lid sealingly covering the electronic element within the recess portion.

* * * * *